(12) United States Patent
Manabe

(10) Patent No.: US 7,531,941 B2
(45) Date of Patent: May 12, 2009

(54) PIEZOELECTRIC ELEMENT AND DRIVING APPARATUS

(75) Inventor: Mitsuo Manabe, Saitama (JP)

(73) Assignee: Fujinon Corporation, Saitama-Shi, Saitama (JP)

( * ) Notice: Subject to any disclaimer, the term of this patent is extended or adjusted under 35 U.S.C. 154(b) by 83 days.

(21) Appl. No.: 11/730,044

(22) Filed: Mar. 29, 2007

(65) Prior Publication Data
US 2007/0228884 A1  Oct. 4, 2007

(30) Foreign Application Priority Data
Mar. 30, 2006  (JP)  ............ P2006-094788

(51) Int. Cl.
H01L 41/08  (2006.01)
(52) U.S. Cl. .................................. 310/323.02
(58) Field of Classification Search .......... 310/328, 310/323.02
See application file for complete search history.

(56) References Cited

U.S. PATENT DOCUMENTS

| | | | | |
|---|---|---|---|---|
| 4,845,399 A | * | 7/1989 | Yasuda et al. | ............... 310/366 |
| 5,239,224 A | * | 8/1993 | Kimura et al. | ............... 310/328 |
| 6,462,464 B2 | * | 10/2002 | Mitarai et al. | ............... 310/366 |
| 6,727,635 B2 | * | 4/2004 | Okamoto et al. | ........ 310/316.01 |
| 7,061,162 B2 | * | 6/2006 | Sato et al. | ................ 310/328 |
| 7,190,104 B2 | * | 3/2007 | Yuasa | ............... 310/317 |
| 7,193,351 B2 | * | 3/2007 | Yoshida | ............... 310/317 |
| 7,268,465 B2 | * | 9/2007 | Okamoto | ........... 310/323.02 |
| 7,368,854 B2 | * | 5/2008 | Manabe | ........... 310/323.17 |

FOREIGN PATENT DOCUMENTS

JP  2633066 B2  4/1997

* cited by examiner

*Primary Examiner*—Mark Budd
(74) *Attorney, Agent, or Firm*—Birch, Stewart, Kolasch & Birch, LLP

(57) ABSTRACT

A piezoelectric element comprises: a first non-extendible and non-contractible portion which neither extend nor contract, the first non-extendible and non-contractible portion being provided at one end of the piezoelectric element; an extendible and contractible portion which extends and contracts; at least one electrode which is provided on a surface of the extendible and contractible portion and is provided so as to extend to a position where a surface of the first non-extendible and non-contractible portion lies; and at least one connecting terminal which is connected to said at least one electrode and is provided in a position where the first non-extendible and non-contractible portion lies.

11 Claims, 7 Drawing Sheets

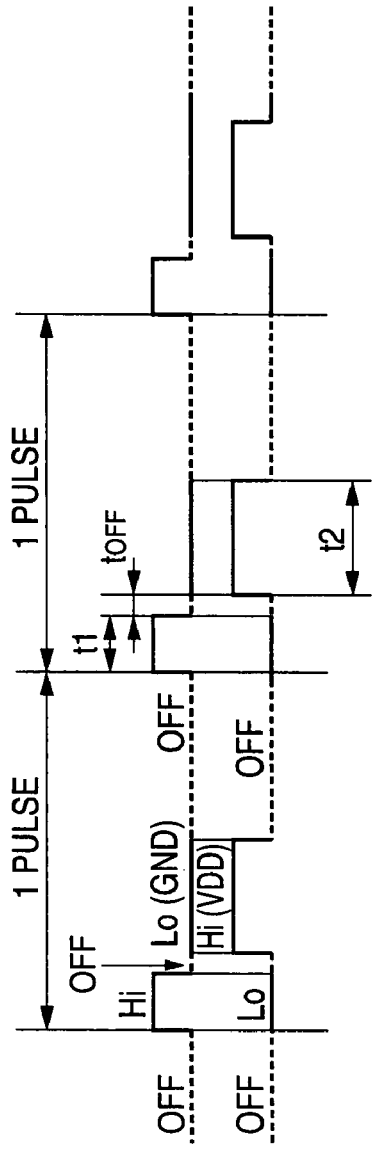
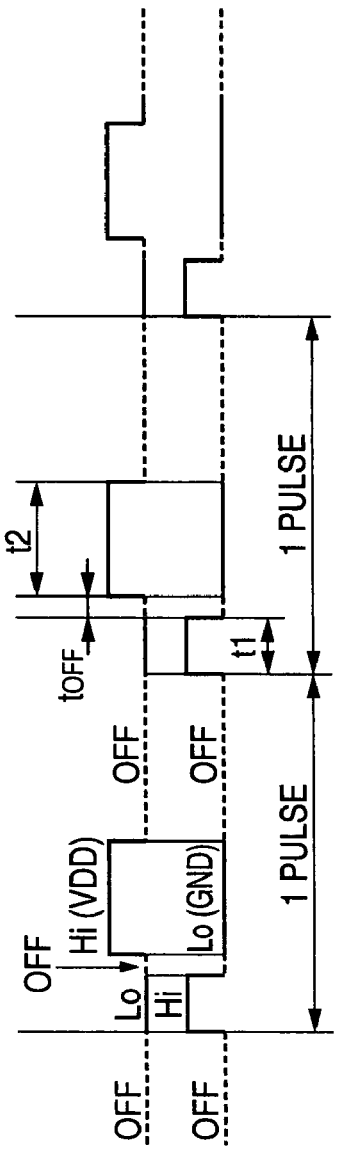
FIG. 6A
FIG. 6B

PIEZOELECTRIC ELEMENT AND DRIVING APPARATUS

BACKGROUND OF THE INVENTION

1. Field of the Invention

The present invention relates to a piezoelectric element which extends and contracts when electric signals are inputted thereinto and a driving apparatus which utilizes the piezoelectric element.

2. Description of the Invention

As the related-art driving apparatus which utilizes a piezoelectric element, there is known, as is described in the Japanese Patent No. 2633066, a driving apparatus in which a drive rod is caused to reciprocate in response to extension and contraction of a piezoelectric element, so as to move a lens barrel which is in frictional engagement with the drive rod along the drive rod. In the piezoelectric element which is used in the driving apparatus, for example, as is shown in FIG. 7, an extendible and contractible portion 103 which extends and contracts is disposed in such a way as to be held by two electrodes 101, 102 therebetween. Lead wires 104, 105 are connected to the belt-shaped electrodes 101, 102, respectively, so that electric signals are inputted into the piezoelectric element though these lead wires 104, 105.

In the driving apparatus and the piezoelectric element like these, however, there may occur a problem that extending and contracting operations of the piezoelectric element are not performed with good efficiency. Namely, since the lead wires 104, 105 are connected to side portions of the extendible and contractible portion of the piezoelectric element, the connecting portions of the lead wires 104, 105 interrupt the extending and contracting motions of the piezoelectric element, leading to the problem that the originally designed operation of the piezoelectric element cannot be performed sufficiently. In particular, when the lead wired 104, 105 are connected to the piezoelectric element through soldering, there may occur a risk that the extending and contracting motions of the piezoelectric element vary depending on the solder connecting state of the lead wires 104, 105.

SUMMARY OF THE INVENTION

Then, the invention was made with a view to solving the technical problem inherent in the related-art piezoelectric element and driving apparatus, and an object thereof is to provide a piezoelectric element and a driving apparatus which can reduce effects which are imposed on the operation of the piezoelectric element by the connecting portions of the lead wires which are connected to the piezoelectric element.

Namely, according to the invention, there is provided a piezoelectric element comprising: a first non-extendible and non-contractible portion which neither extend nor contract, the first non-extendible and non-contractible portion being provided at one end of the piezoelectric element; an extendible and contractible portion which extends and contracts; at least one electrode which is provided on a surface of the extendible and contractible portion and is provided so as to extend to a position where a surface of the first non-extendible and non-contractible portion lies; and at least one connecting terminal which is connected to said at least one electrode and is provided in a position where the first non-extendible and non-contractible portion lies.

According to the invention, due to the connecting terminal being provided at the non-extendible and non-contractible portion, a wiring member for inputting electric signals into the electrode is connected to the connecting terminal at the non-extendible and non-contractible portion by means of soldering or the like. Because of this, since the connecting portion with the wiring member does not exist in the position where the extendible and contractible portion lies, a risk can be avoided that the connecting portion affects the extending and contracting motions of the extendible and contractible portion. Consequently, a good operation property can be obtained. In addition, since the connecting terminal is formed at the end portion of the electrode, a good wettability of solder is obtained when the wiring member is connected to the connecting terminal, whereby a connecting process can be implemented smoothly.

In the piezoelectric element according to the invention, it is preferred that said at least one electrode comprises two electrodes provided in such a way as to sandwich the extendible and contractible portion, and said at least one connecting terminal comprises two connecting terminals that are provided to be connected to the two electrodes, respectively, and are both provided on a side of the one end of the piezoelectric element where the first non-extendible and non-contractible portion lies.

According to the invention, since the two connecting terminals are formed at the same end portion of the piezoelectric element, the piezoelectric element can be connected to the wiring member by means of reflow. Consequently, a good productivity can be obtained for products which utilizes such piezoelectric elements.

In addition, according to the invention, there is provided a driving apparatus comprising: a piezoelectric element; a driving shaft that reciprocates in response to an extension and contraction of the piezoelectric element; and a driven member, frictionally engaged with the driving shaft, that moves along the driving shaft by reciprocating the driving shaft, wherein the piezoelectric element comprises: a first non-extendible and non-contractible portion which neither extend nor contract, the first non-extendible and non-contractible portion being provided at one end of the piezoelectric element; an extendible and contractible portion which extends and contracts; at least one electrode which is provided on a surface of the extendible and contractible portion and is provided so as to extend to a position where a surface of the first non-extendible and non-contractible portion lies; and at least one connecting terminal which is connected to said at least one electrode and is provided in a position where the first non-extendible and non-contractible portions lies.

According to the invention, due to the connecting terminal being provided at the non-extendible and non-contractible portion, a wiring member for inputting electric signals into the electrode is connected to the connecting terminal at the non-extendible and non-contractible portion by means of soldering or the like. Because of this, since the connecting portion with the wiring member does not exist in the position where the extendible and contractible portion lies, a risk can be avoided that the connecting portion affects the extending and contracting motions of the extendible and contractible portion. Consequently, the extending and contracting performance of the piezoelectric element is improved, thereby making it possible to realize an increase in the driven member moving performance of the piezoelectric element. In addition, since the connecting terminal is formed at the end portion of the electrode, a good wettability of solder is obtained when the wiring member is connected to the connecting terminal, whereby a connecting process can be implemented smoothly.

In addition, in the driving apparatus according to the invention, it is preferred that said at least one electrode comprises two electrodes provided in such a way as to sandwich the extendible and contractible portion, and said at least one connecting terminal comprises two connecting terminals that are provided to be connected to the two electrodes, respectively, and are both provided on a side of the one end of the piezoelectric element where the first non-extendible and non-contractible portion lies.

According to the invention, since the two connecting terminals are formed at the same end portion of the piezoelectric element, the piezoelectric element can be connected to the wiring member by means of reflow. Consequently, the assembling of the piezoelectric element is facilitated, thereby making it possible to realize an increase in productivity of driving apparatuses.

In addition, in the driving apparatus according to the invention, it is preferred that the driving shaft is attached to the other end of the piezoelectric element, and the driving apparatus further comprises a wiring member, attached to the one end of the piezoelectric element, that is to be connected to said at least one connecting terminal.

According to the invention, since the wiring member is connected to the end portion of the piezoelectric element, the wiring member scarcely interrupts the assemblage of the piezoelectric element on to a driving apparatus, whereby the assemblage of piezoelectric elements can be increased.

Additionally, in the driving apparatus according to the invention, it is preferred that the piezoelectric element further comprises a second non-extendible and non-contractible portion provided at the other end of the piezoelectric element, the one end of the piezoelectric element to which the wiring member is preferably attached is made to constitute a free end, and the first non-extendible and non-contractible portion become heavier than the second non-extendible and non-contractible portion.

According to the invention, by making heavier the non-extendible and non-contractible portion that is formed on the other end portion of the piezoelectric element where the wiring member is attached, the relevant non-extendible and non-contractible portion can be made to function as a weight member. Because of this, when the piezoelectric element extends or contracts, the one of the end portions of the piezoelectric element can be displaced largely, thereby making it possible to move the driven member with good efficiency.

BRIEF DESCRIPTION OF THE DRAWINGS

FIGS. 6A and 6B are diagrams showing waveforms of output signals which are outputted from the driving circuit shown in FIG. 4.

DETAILED DESCRIPTION OF THE INVENTION

Figure 1:
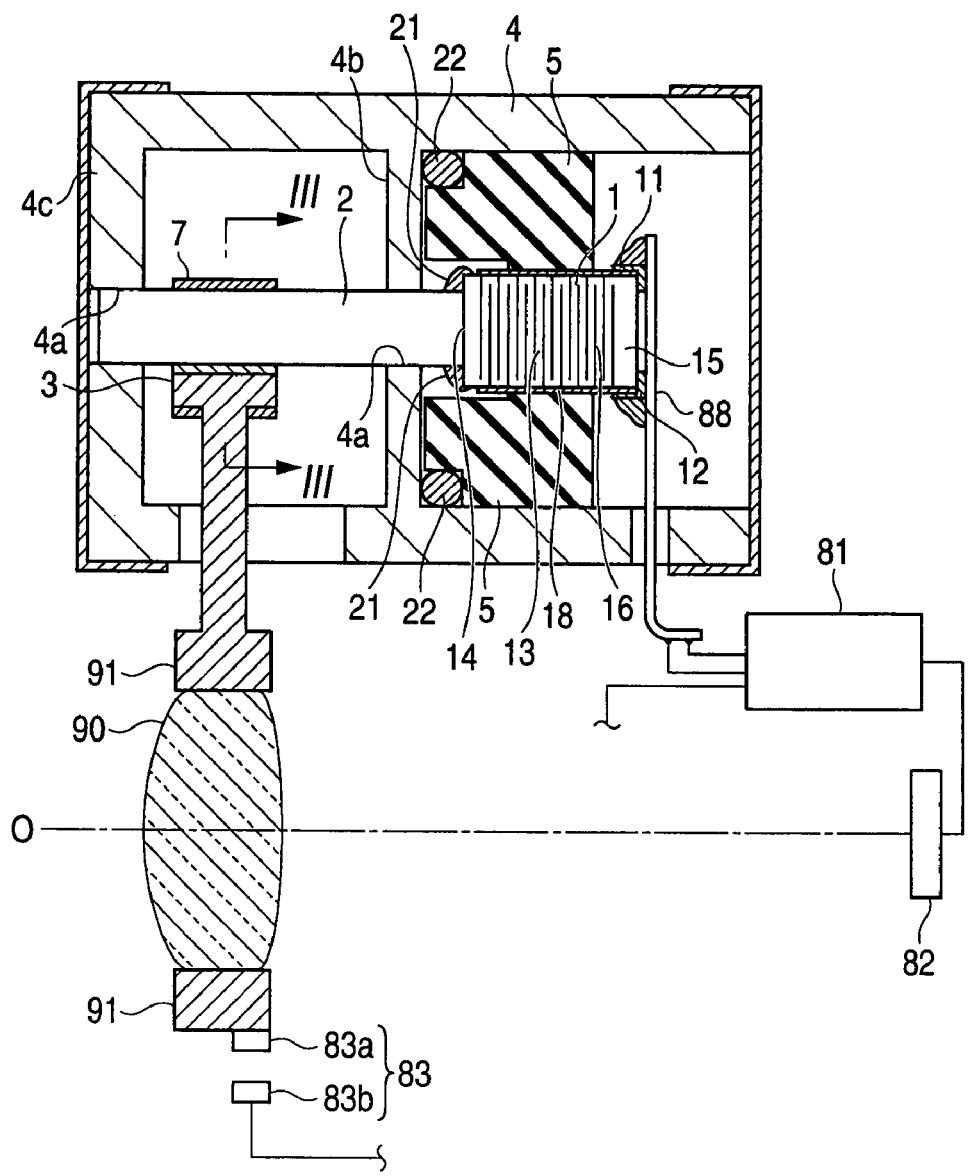
FIG. 1 is a sectional view showing a driving apparatus according to an embodiment of the invention.

Hereinafter, an embodiment of the invention will be described in detail by reference to the accompanying drawings. Note that in description of the drawings, like reference numerals are imparted to like elements, and the repetition of the same description will be omitted.

Figure 2:
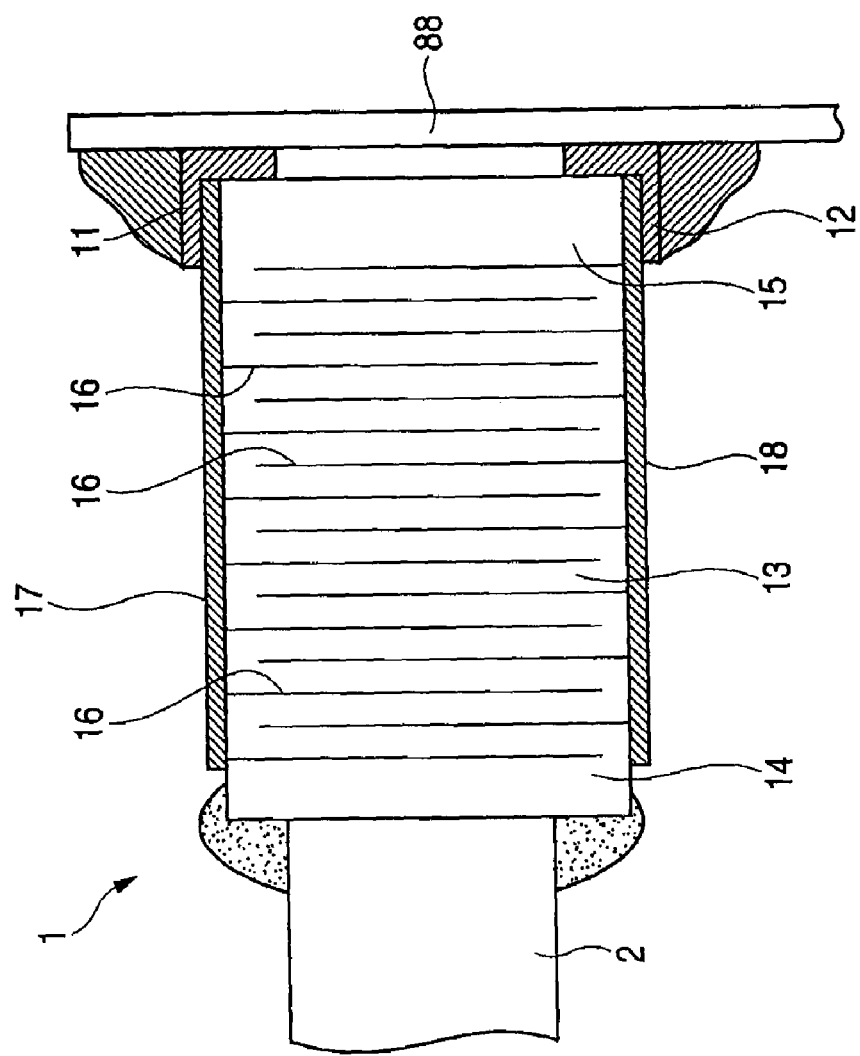
FIG. 2 is an enlarged view of a piezoelectric element in the driving apparatus shown in FIG. 1.

FIG. 1 is a sectional view of a driving apparatus according to an embodiment of the invention. FIG. 2 is an enlarged side view of a piezoelectric element 1 which is used in the driving apparatus according to the embodiment.

As is shown in FIG. 1, the driving apparatus according to the embodiment is such as to move a driven member 3 which is in frictional engagement with a driving shaft 2 along the driving shaft 2 by reciprocating the driving shaft 2 in response to extension and contraction of the piezoelectric element 1.

The piezoelectric element 1 is an electromechanical transducer which can extend and contract when electric signals are inputted and is designed to extend and contract in a predetermined direction. This piezoelectric element 1 is connected to a control unit 81 via a printed wiring substrate 88, so as to be caused to extend and contract when electric signals are inputted by the control unit 81. For example, two input terminals 11, 12 are provided on the piezoelectric element 1. By repeatedly increasing and decreasing a voltage that is impressed to these input terminals 11, 12, the piezoelectric element 1 is caused to extend and contract repeatedly.

A flexible wiring substrate having a flexibility is preferably used for the printed wiring substrate 88. In this case, since the printed wiring substrate 88 does not interrupt the movement of the free end of the piezoelectric element 1, smooth extending and contracting motions of the piezoelectric element 1 are allowed.

As is shown in FIG. 2, non-extendible and non-contractible portions 14, 15 are formed at end portions of the piezoelectric element 1. The non-extendible and non-contractible portion 14 is formed at the end portion of the piezoelectric element 1 where the driving shaft 2 is attached. The non-extendible and non-contractible portion 15 is formed on the opposite end portion of the piezoelectric element 1 to the end portion where the non-extendible and non-contractible portion 14 is formed. The non-extendible and non-contractible portions 14, 15 are portions which do not contribute to the extending and contracting operation of the piezoelectric element and are generally designated as a dummy layer.

An extendible and contractible portion 13 is formed between the non-extendible and non-contractible portions 14, 15. The extendible and contractible portion 13 is a portion which extends and contracts when electric signals are inputted into the piezoelectric element 1 and is designated as an active layer. In this extendible and contractible portion 13, for example, a plurality of internal electrodes 16 are provided to be aligned in parallel to each other along a direction of extension and contraction of the piezoelectric element 1, and ceramic is interposed between the internal electrodes 16.

Electrodes 17, 18 are provided on side portions of the extendible and contractible portion 13. The electrodes 17, 18 are electrodes which are formed on a surface of the piezoelectric element 1 and are connected to the internal electrodes 16, respectively. The electrodes 17, 18 are placed, for example, on both sides of the extendible and contractible portion 13 in such a manner as to sandwich it. The electrodes 17, 18 are provided so as to extend to positions on the piezoelectric element where side portions of the non-extendible and non-contractible portion 15 lie. An input terminal 11 is connected to the electrode 17, and an imputer terminal 12 is connected to the electrode 18.

The input terminals 11, 12 are such as to function as connecting terminals which establish a connection with the printed wiring substrate 88 which functions as a wiring member, and are provided on positions on the piezoelectric element 1 where the non-extendible and non-contractible portion 15 lies. These input terminals 11, 12 are connected to the printed wiring substrate 88 by means of soldering. In addition, the input terminals 11, 12 are preferably formed into a shape having an L-shaped cross section so as to match the shape of corner portions of the piezoelectric element 1. In this case, the input terminals 11, 12 are then allowed to cover not only side portions of the piezoelectric element 1 but also a surface of the end portion thereof, whereby the input terminals 11, 12 can easily be connected to the printed wiring substrate 88 by means of reflow.

The non-extendible and non-contractible portion 15 where the input terminals 11, 12 are placed is preferably formed larger than the non-extendible and non-contractible portion 14 which is formed at the opposite end portions of the piezoelectric element 1. As this occurs, wide spaces where the input terminals 11, 12 are to be placed can be provided on the side portions of the non-extendible and non-contractible portion 15, whereby the placement of the input terminals 11, 12 is facilitated. In addition, by forming the non-extendible and non-contractible portion 15 larger, the non-extendible and non-contractible portion 15 becomes heavier than the non-extendible and non-contractible portion 14, whereby the non-extendible and non-contractible portion 15 can be made to function as a weight member, whereby the end portion of the piezoelectric element 1 where the driving shaft 2 is attached can be displaced largely when the piezoelectric element 1 extends and contracts, thereby making it possible to move the driven member 3 with good efficiency.

In addition, the non-extendible and non-contractible portion 15 may be made of a material whose mass is larger than that of the non-extendible and non-contractible portion 14. For example, by making the non-extendible and non-contractible portion 15 of not ceramic but metal, the non-extendible and non-contractible portion 15 can be formed heavier than the non-extendible and non-contractible portion 14. Even in this case, the non-extendible and non-contractible portion 15 can be made to function as the weight member, thereby making it possible to move the driven member 3 with good efficiency.

In FIG. 1, the driving shaft 2 is attached to the piezoelectric element 1 in such a way as to extend therefrom longitudinally in the direction of extension and contraction of the piezoelectric element 1. For example, one end of the driving shaft 2 is brought into abutment with the piezoelectric element 1 and is bonded thereto using an adhesive. The driving shaft 2 is a long member, and for example, a circular pillar-like part is used therefor. The driving shaft 2 is supported longitudinally movably by partitioning portions 4b, 4c which extend inwards from a stationary frame 4. The partitioning members 4b, 4c are members for defining a moving area of the driven member 3 and also function as support members for supporting the driving shaft 2. The stationary frame 4 functions as a box element in which the piezoelectric element 1, the driving shaft 2 and the driven member 3 are accommodated for assemblage.

A soft and highly rigid material is suitable as a material for the driving shaft 2, and beryllium is an ideal material which satisfies the condition. Beryllium has drawbacks, however, that it is expensive because it is a scarce metal and is difficult to work. Then, in this embodiment, a graphite composite material such as carbon graphite is used in which graphite crystals are combined strongly and rigidly. (Here, the graphite composite material means a composite material made up of a graphite which is a hexagonal plate-shaped crystalline form of carbon and a substance other than graphite, and carbon graphite means a substance which is made up of graphite and amorphous carbon. In addition, graphite is also called black lead or plumbago.) Carbon graphite, which is a graphite composite material, has a property which is similar to beryllium (the specific weight of beryllium is about 1.85, while the specific weight of carbon graphite is about 1.8) and a property that it is easy to work, compared to beryllium. Note that the shape of the driving shaft 2 is not limited to the circular pillar-like shape and hence may be formed into an angular pillar-like shape.

A through hole 4a is formed in each of the partitioning portions 4b, 4c through which the driving shaft 2 is passed. The partitioning portion 4b supports the driving shaft 2 at a location in the vicinity of a portion where the driving shaft 2 is attached to the piezoelectric element 1, that is, a proximal end location of the driving shaft 2. The partitioning portion 4c supports a distal end location of the driving shaft 2. By being attached to the piezoelectric element 1, the driving shaft 2 reciprocates along the longitudinal direction thereof in response to extension and contraction of the piezoelectric element 1.

Note that while in FIG. 1, the case is described in which the driving shaft 2 is supported at the two proximal end side and distal end side locations by the partitioning portions 4b, 4c, there may occur a case where the driving shaft 2 is supported on either the proximal end side or the distal end side thereof. For example, by forming the through hole 4a in the partitioning portion 4b larger than the outside diameter of the driving shaft 2, the driving shaft 2 is supported at only the distal end location by the partitioning portion 4c. In addition, by forming the through hole 4a in the partitioning portion 4c larger than the outside diameter of the driving shaft 2, the driving shaft 2 is supported at only the proximal end location by the partitioning portion 4b.

In addition, while in FIG. 1, the partitioning portions 4b, 4c which support the driving shaft 2 are described as being integrated with the stationary frame 4, these partitioning portions 4b, 4c may be made up of separate elements from the stationary frame 4, so as to be mounted on the stationary frame 4 afterwards. Also when the partitioning portions are formed as separated elements, a similar function and advantage to those provided by the integrated partitioning portions can be obtained.

The driven member 3 is movably mounted on the driving shaft 2. This driven member 3 is mounted on the driving shaft 2 in such a state that the driven member 3 is in frictional engagement with the driving shaft 2 and is allowed to move along the longitudinal direction of the driving shaft 2. For example, the driven member 3 is brought into press contact with the driving shaft 2 by means of a leaf spring 7 so as to be in frictional engagement with the driving shaft 2 with a predetermined friction coefficient, so as to be pressed against the driving shaft 2 under a certain determined pressure, whereby the driven member 3 is mounted on the driving shaft 2 in such a manner as to produce a certain determined frictional force as it moves. When the driving shaft 2 moves to overcome the frictional force, the driven member 3 maintains the position where it is by virtue of inertia, whereby the driving shaft 2 moves relative to the driven member 3 which is left in its position.

The piezoelectric element 1 is mounted on the stationary frame 4 by a support member 5. The support member 5 is such as to be mounted in such a manner as to support the piezoelectric element 1 from sides thereof relative to the direction of extension and contraction thereof and is interposed between the piezoelectric element 1 and the stationary frame 4. In this case, the piezoelectric element 1 is preferably supported by the support member 5 from a direction which intersects the direction of extension and contraction of the piezoelectric element 1 at right angles. The support member 5 functions as a mounting member which supports the piezoelectric element 1 from the sides thereof for mounting.

The support member 5 is formed of an elastic element having an elastic property which is equal to or larger than a predetermined level and is formed of, for example, a silicone resin. The support member 5 is made to have a through hole 5a which is provided so that the piezoelectric element 1 is passed therethrough and is assembled to the stationary frame 4 in such a state that the piezoelectric element 1 is inserted thereinto. The support member 5 is secured to the stationary frame 4 by virtue of bonding using an adhesive 22. In addition, the support member 5 is also secured to the piezoelectric element 1 by virtue of bonding using the adhesive. By making up the support member 5 of the elastic element, the support member 5 can support the piezoelectric element 1 in such a manner as to move in the direction of extension and contraction thereof. In FIG. 1, although two support members 5 are illustrated to lie on both the sides of the piezoelectric element 1, respectively, these support members 5, 5 are so illustrated due to the annular support member 5 being shown in a sectional view which results by cutting it along a horizontal plane.

In addition, the support member 5 may be secured to the stationary frame 4 and the piezoelectric element 1 by press fitting the support member 5 between the stationary frame 4 and the piezoelectric element 1 so that the support member 5 is pressed against the stationary frame 4 and the piezoelectric element 1, respectively. For example, a support member 5 is made up of an elastic element into a size or thickness which is larger than a space defined between the stationary frame 4 and the piezoelectric element 1, and the support member 5 so made is press fitted into the space so as to be placed therein. As this occurs, the support member 5 is provided in such a manner as to be closely secured to the stationary frame 4 and the piezoelectric element 1. As this occurs, the piezoelectric element 1 is pressed against by the support member 5 from both the sides thereof in the direction which intersects the direction of extension and contraction of the piezoelectric element 1 at right angles, whereby the piezoelectric element 1 is supported.

In addition, while the support member 5 has been described as being formed of the silicone resin here, the support member 5 may be made up of a spring member. For example, a spring member is interposed between the stationary frame 4 and the piezoelectric element 1 so that the piezoelectric element 1 is supported relative to the stationary frame 4 by this spring member.

A movable lens 90 is mounted on the driven member 3 via a lens frame 91. The movable lens 90 is such as to make up a photographic optical system of a camera and constitutes an object to be moved by the driving apparatus. This movable lens 90 is provided integrally with the driven member 3 and is provided in such a way as to move together with the driven member 3. A stationary lens and the like, not shown, are provided on an optical axis O of the movable lens 90, so as to make up the photographic optical system of the camera. In addition, a photographic device 82 is provided on the optical axis O. The photographic device 82 is a photographic unit for converting an image formed by the photographic optical system into an electric signal and is made up of, for example, a CCD. The photographic device 82 is connected to the control unit 81 and output an image signal to the control unit 81.

A detector 83 is provided on the driving apparatus for detecting a moving position of the driven member 3. As the detector 83, for example, an optical detector is used, and a photoreflector, photointerrupter or the like is used. To be specific, in a case where a device including a reflector 83a and a detecting unit 83b is used as the detector 83, the reflector 83a is attached to the lens frame 91 which is formed integrally with the driven member 3, whereby a detection light is emitted from the detecting unit 83b to the reflector 83a side, and a reflection light which is reflected by the reflector 83a side is then detected by the detecting unit 83b so as to detect the moving position of the driven member 3 and the movable lens 90.

The detector 83 is connected to the control unit 81. An output signal of the detector 83 is inputted into the control unit 81. The control unit 81 is such as to control the whole of the driving apparatus, and is made up of, for example, a CPU, a ROM, a RAM, an input signal circuit, an output signal circuit and the like. In addition, the control unit 81 includes a driving circuit for activating the piezoelectric element 1 for operation, and a driving electric signal is outputted to the piezoelectric element 1 by this driving circuit.

Figure 3:
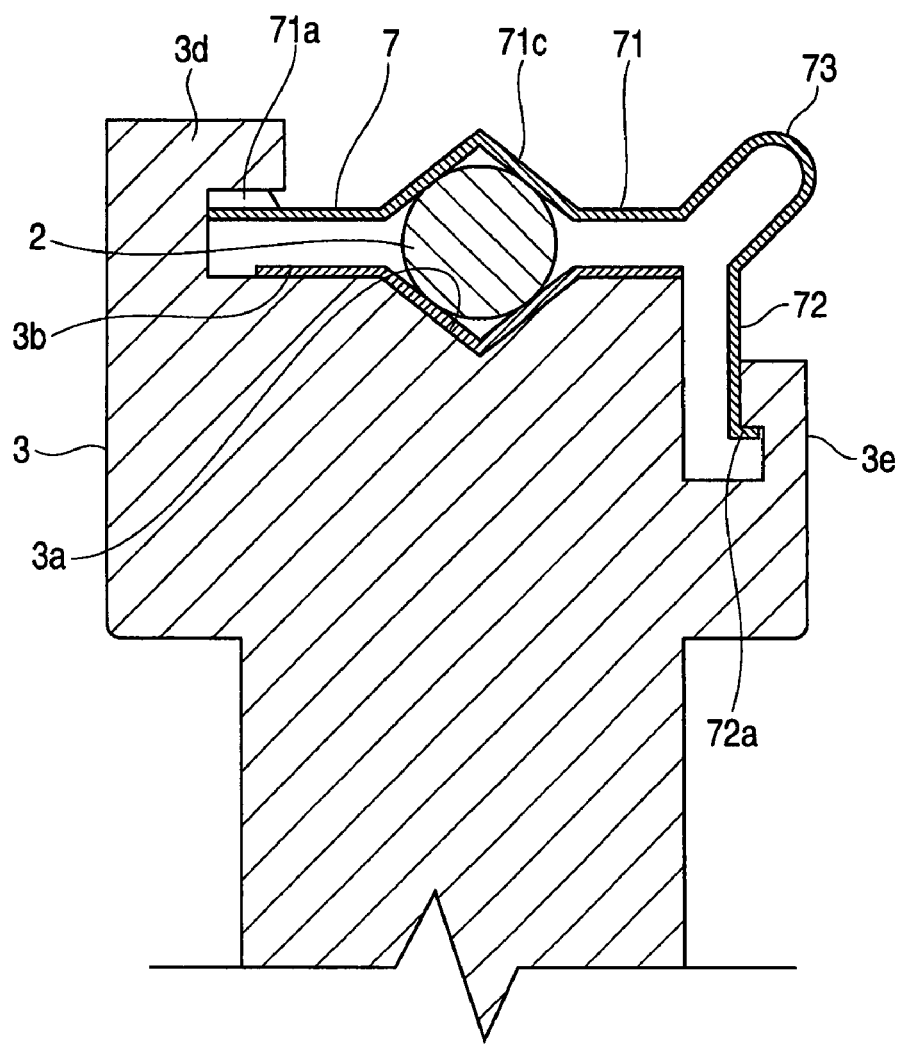
FIG. 3 is a sectional view of a driven member taken along the line III-III in FIG. 1.

FIG. 3 is a sectional view of a frictional engagement portion of the driven member 3 which is taken along the line III-III in FIG. 1.

As is shown in FIG. 3, the driven member 3 is brought into press contact with the driving shaft 2 by the leaf spring 7 in such a manner that the drive member 3 is in frictional engagement with the driving shaft 2. A V-shaped groove 3a is formed in the driven member 3. A sliding plate 3b is additionally provided on a surface of the groove 3a so formed. The sliding plate 3b is a plate element on which the driving shaft 2 slides and is bent into a shave having a V-shaped cross section to match the surface configuration of the groove 3a. The attachment of the sliding plate 3b to the driven member 3 is implemented by an adhesive. In addition, the sliding plate 3b may be molded integrally with the driven member 3. The sliding plate 3b is made of, for example, a material which is harder than the driven member 3.

The driving shaft 2 is placed within the groove 3a in such a way as to be brought into abutment with the sliding plate 3b. The leaf spring 7 is provided in such a way as to hold the driving shaft 2 between the driven member 3 and itself. The leaf spring 7 is provided to be oriented towards a direction which intersects the driving shaft 2 and is provided, for example, in a direction in which the leaf spring 7 intersects the driving shaft 2 at right angles.

The leaf spring 7 is formed to be bent into an L-shape and is made up of a plate-shaped piece 71 which is adapted to be brought into abutment with the driving shaft 2 and a plate-shaped piece 72 which is formed to be bent relative to the plate-shaped piece 71. Here, the L-shape includes not only a case where the leaf spring 7 is bent such that the plate-shaped pieces 71, 72 intersect each other at right angles but also a case where the leaf spring 7 is bent such that the plate-shaped pieces 71, 72 intersect each other at angles in a range of the order of are 90+/−20°.

End portions of the plate-shaped pieces 71, 72 are hooked on the driven member 3, respectively. Namely, both ends of the leaf spring 7 are not fastened by screws but are hooked on the driven member 3, respectively. The end portion of the plate-shaped piece 71 is hooked on a hook portion 3d which is formed on the driven member 3 in the form of a hook. The end portion of the plate-shaped piece 72 is hooked on a hook portion 3e which is formed on the driven member 3 in the form of a hook. A hook portion 72a is formed at the end portion of the plate-shaped piece 72 in such a manner as to be bent outwards. The hook portion 72a is in engagement with the hook portion 3e, whereby a sliding dislocation of the plate-shaped piece 72 in the longitudinal direction is prevented.

A projecting portion 71a which projects outwards is formed at the end portion of the plate-shaped piece 71. The projecting portion 71a constitutes a location where the leaf spring 7 is brought into point contact with the driven member 3. This projecting portion 71a is formed by, for example, bending a central portion of the end portion of the leaf spring 7 into an inverted V-shape along the longitudinal direction thereof.

A sliding portion 71c which is bent into an inverted V-shape is formed at an intermediate portion of the plate-shaped piece 71 of the leaf spring 7. The sliding portion 71c is brought into abutment with the driving shaft 2, whereby the driven member 3 and the driving shaft 2 are brought into press contact with each other under a predetermined pressure, and a state results in which the driven member 3 and the driving shaft 2 are in frictional engagement with each other with a predetermined friction coefficient. This sliding portion 71c is formed in a position which faces the groove 3a in the driven member 3.

A curved portion 73 is formed at the bent portion of the leaf spring 7 in such a manner as to project outwards. The curved portion 73 is provided at a curved portion between the plate-shaped piece 71 and the plate-shaped piece 72 and is formed to project to the outside of the curve in a curved fashion compared to a case where the plate-shaped piece 71 and the plate-shaped piece 72 are connected together at right angles to each other.

By holding the driving shaft 2 by the sliding plate 3b having the V-shaped cross section and the sliding portion 71c having the inverted V-shaped cross section in this way, the driven member 3 is made to be brought into linear contact with the driving shaft 2 at a plurality of locations, whereby the driven member 3 can be brought into frictional engagement with the driving shaft 2 in a stable fashion. In addition, since the driven member 3 is in engagement with the driving shaft 2 by virtue of the linear contact state realized at the plurality of locations, an engagement state substantially results which is similar to an engagement state in which the driven member 3 is in surface engagement with the driving shaft 2, thereby making it possible to realize a stable friction engagement therebetween.

Note that in FIG. 2, the sliding plate 3b is formed into the shape having the V-shaped cross section and the sliding portion 71c is formed into the shape having the inverted V-shaped cross section, the sliding plate 3b and the sliding portion 71c may be made into a shape having an arc-shaped cross section which extends along a circumferential surface of the driving shaft 2, so as to be brought into surface contact with the driving shaft 2. As this occurs, since the driven member 3 is brought into engagement with the driving shaft 2 in such a state that the driven member 3 is in surface contact with the driving shaft 2, the driven member 3 is allowed to be brought into frictional engagement with the driving shaft 2 in a stable fashion.

Figure 4:
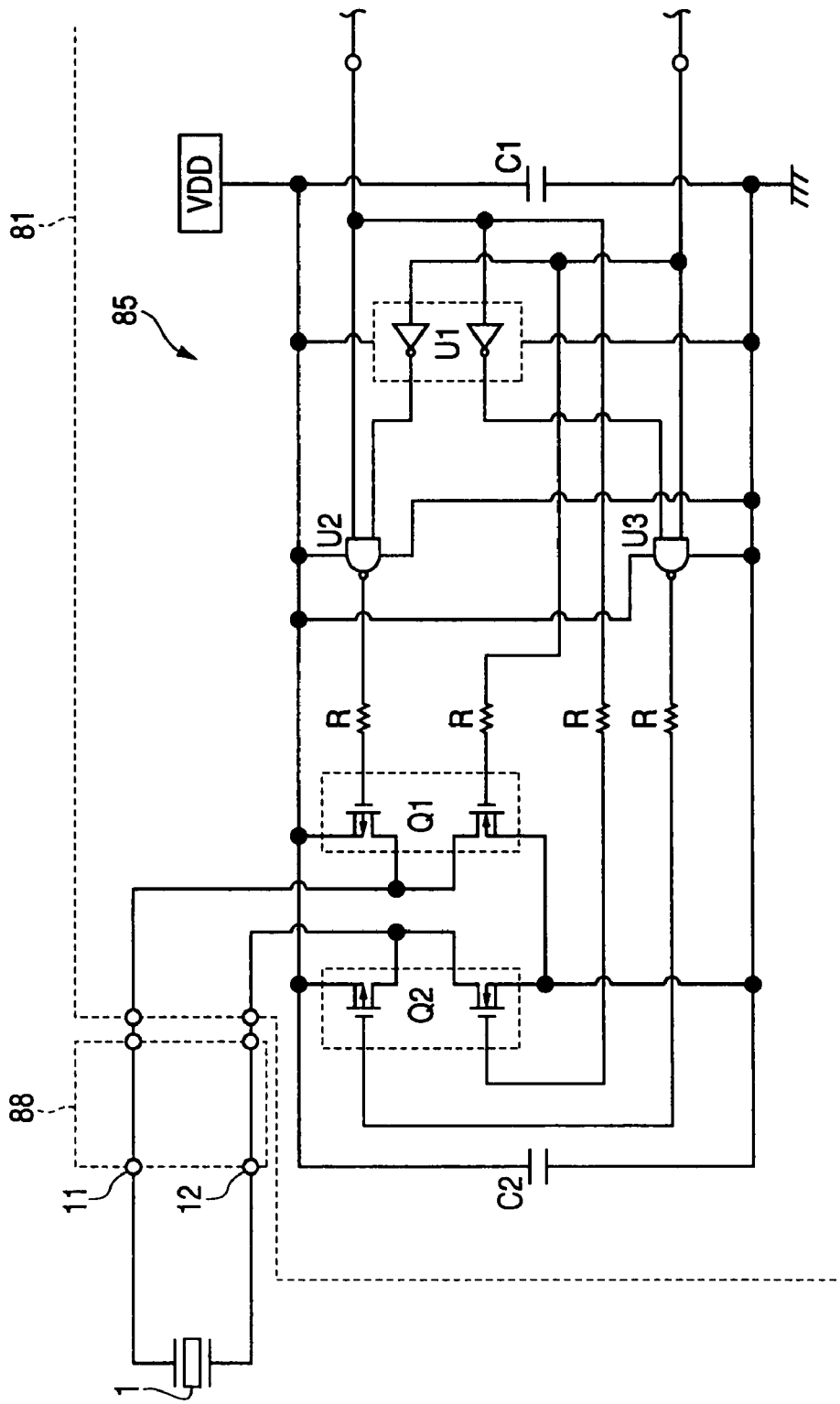
FIG. 4 is a diagram showing a driving circuit in the driving apparatus shown in FIG. 1.

FIG. 4 is a circuit diagram of a driving circuit for operating the piezoelectric element 1.

As is shown in FIG. 4, a driving circuit 85 is provided to be disposed within the control unit 81. This driving circuit 85 is such as to function as a drive circuit for the piezoelectric element 1 and to output a driving electric signal to the piezoelectric element 1. The driving circuit 85 receives a control signal which is inputted thereinto from a control signal generating unit (not shown) of the control unit 81 and outputs a driving electric signal for the piezoelectric element 1 by amplifying the control signal with respect to voltage or current. For example, a circuit in which an input stage is made up of logic circuits U1 to U3 and field-effect transistors (FET) Q1, Q2 are provided for use as an output state is used for the driving circuit 85. The transistors Q1, Q2 are designed to be able to output, as output signals, an H output (a high potential output), an L output (a low potential output) and an OFF output (an open output).

Figure 5A:
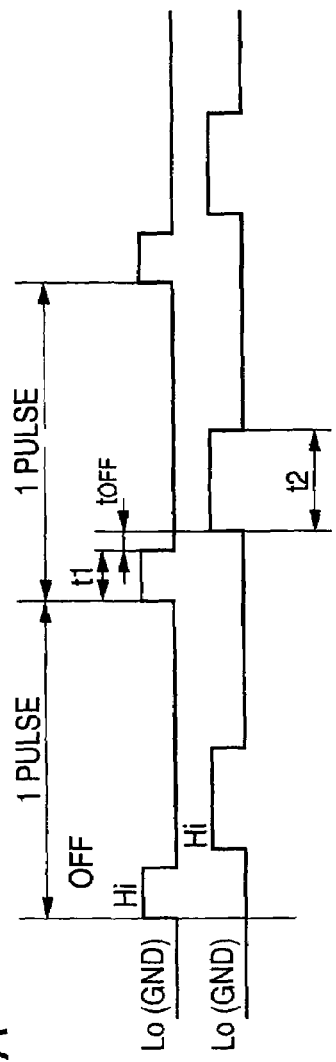
FIGS. 5A and 5B are diagrams showing waveforms of input signals which are inputted into the driving circuit shown in FIG. 4.
Figure 5B:
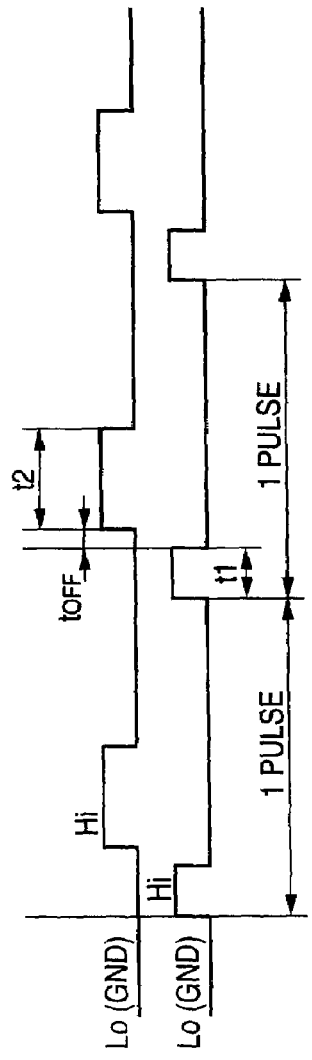
Figure 7:
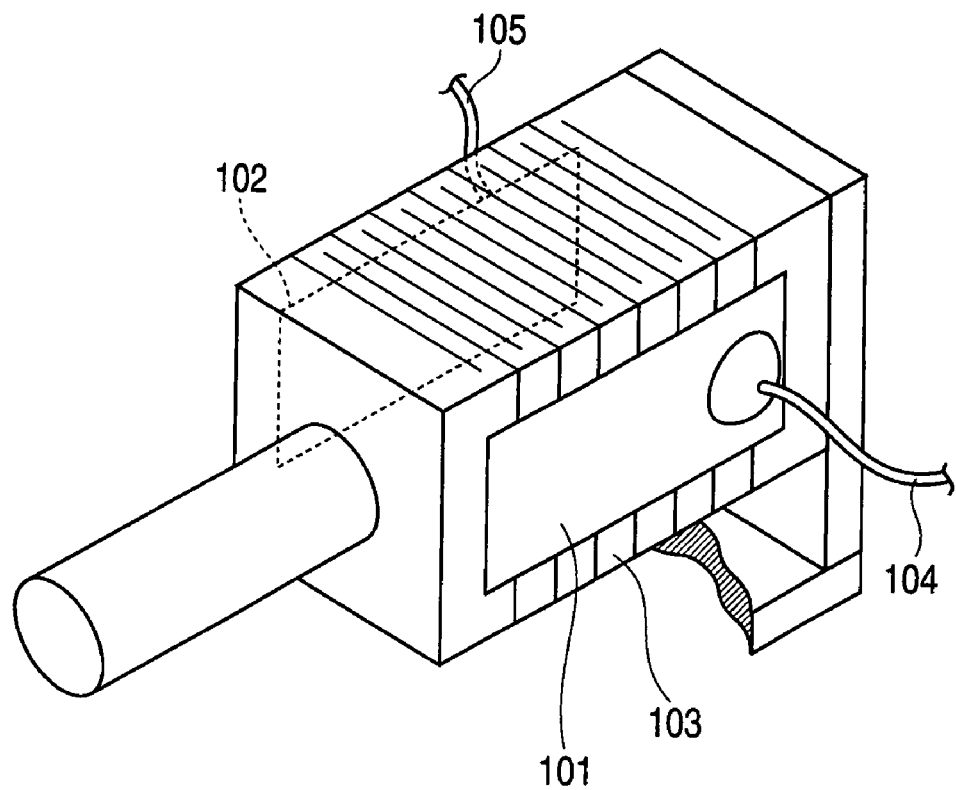
FIG. 7 is an explanatory diagram of the related-art technique.

FIG. 5 shows input signals which are inputted into the driving circuit 85, and FIG. 6 shows output signals which are outputted from the driving circuit 85. FIG. 5A shows an input signal which is inputted when causing the driven member 3 to move in the direction in which the driven member 3 approaches the piezoelectric element 1 (rightwards as seen in FIG. 1), and FIG. 5B shows an input signal which is inputted when causing the driven member 3 to move in the direction in which the driven member 3 moves away from the piezoelectric element 1 (leftwards as seen in FIG. 1). In addition, FIG. 6A shows an output signal which is outputted when causing the driven member 3 to move in the direction in which the driven member 3 approaches the piezoelectric element 1 (rightwards as seen in FIG. 1), and FIG. 6(B) shows an output signal which is outputted when causing the driven member 3 to move in the direction in which the driven member 3 moves away from the piezoelectric element 1 (leftwards as seen in FIG. 1).

The output signals in FIGS. 6A and 6B are made to be pulse signals which are on and off at the same timing as the input signals shown in FIGS. 5A and 5B. The two signals in FIGS. 6A and 6B are inputted into the input terminals 11, 12 of the piezoelectric element 1. Although signals made up of trapezoidal waveforms may be inputted into the input terminals 11, 12, the rectangular pulse signals shown in FIG. 6 can be inputted so as to activate the piezoelectric element 1. As this occurs, since the driving signal of the piezoelectric element 1 may take the form of the rectangular pulse signal, the signal generation is facilitated.

The output signals shown in FIGS. 6A and 6B are each made up of two rectangular pulse signals having the same frequency. These two pulse signals are made to be signals in which a potential difference between respective signals increases in a stepped fashion and decreases drastically or the potential difference increases drastically and decreases in a stepped fashion by causing their phases to differ from each other. By inputting the two signals, the extension speed and contraction speed of the piezoelectric element 1 can be caused to differ from each other, whereby the driven member 3 can be caused to move.

For example, of the two signals shown in FIGS. 6A and 6B, it is set such that the other signal becomes H (high) after one signal becomes H (high) and is then decreased to L (low). In those signals, it is set such that when one signal becomes L, the other signal becomes H after a certain determined time lag $t_{OFF}$ has elapsed. In addition, in the event that the two signals are both L, the output state becomes an off state (an open state).

As the output signals or electric signals shown in FIG. 6A and 6B which activate the piezoelectric element 1, a signal is used whose frequency exceeds the audible frequency. In FIGS. 6A and 6B, the frequencies of the two signals are made to be a signal frequency which exceeds the audible frequency, and a signal frequency of, for example, 30 to 80 kHz is preferably used, and a signal frequency of 40 to 60 kHz is more preferably used. By using signals having these frequencies, the operation noise of the piezoelectric element 1 within the audible frequency area can be reduced.

In addition, assuming that the driving frequency of the driving signal (electric signal) for activating the piezoelectric element 1 is f, and the resonance frequency of vibrations in the piezoelectric element 1 and the driving shaft 2 is $f_0$, it is preferable to satisfy a relationship of $f \geq 2^{1/2} \cdot f_0$. As this occurs, the vibration transmission rate of vibration resulting from the extension and contraction motions of the piezoelectric element 1 can be suppressed to a range equal to 1 or less, thereby making it possible to reduce the resonance effect. As a combination of frequencies, for example, the resonance frequency $f_0$ is made to be equal to or less than 70 kHz, and the driving frequency f is made to range from 50 to 100 kHz, whereby the aforesaid relationship of $f \geq 2^{1/2} \cdot f_0$ can be satisfied.

Next, the operation of the driving apparatus according to the embodiment will be described.

In FIG. 1, electric signals are inputted into the piezoelectric element 1, and the piezoelectric element 1 repeats its extension and contraction when the electric signals are so inputted. The driving shaft 2 reciprocates in response to the extension and contraction of the piezoelectric element 1. As this occurs, by causing the extension speed and contraction speed of the piezoelectric element 1 to differ from each other, a speed at which the driving shaft 2 moves to a certain determined direction and a speed at which the driving shaft 2 moves to an opposite direction are caused to differ from each other, whereby the driven member 3 and the movable lens 90 can be caused to move in desired directions.

Since the input terminals 11, 12 of the piezoelectric element 1 are provided in the position of the piezoelectric element where the non-extendible and non-contractible portion 15 lies, the portions where the input terminals 11, 12 are solder connected to the printed wiring substrate 88 interrupt the extending and contracting motions of the piezoelectric element 1 when the piezoelectric element 1 extends and contracts. Because of this, the driven member 3 and the movable lens 90 can be moved with good efficiency by virtue of the extending and contracting motions of the piezoelectric element 1.

In addition, the non-extendible and non-contractible portion 15 can be made to function as the weight member by making the non-extendible and non-contractible portion 15 heavier than the non-extendible and non-contractible portion 14, whereby extension and contraction forces of the piezoelectric element 1 are made easier to be transmitted to the driving shaft 2 side, thereby making it possible to realize an increase in moving properties of the driven member 3 and the movable lens 90.

Furthermore, although vibrations are generated due to extension and contraction of the piezoelectric element 1 when it extends and contracts, since the piezoelectric element 1 is supported from the sides thereof relative to the direction of extension and contraction thereof by the support member 5, vibrations generated by the extension and contraction of the piezoelectric element 1 are made difficult to be transmitted to the outside of the piezoelectric element 1 and the driving shaft 2. Because of this, the resonance of the piezoelectric element 1 and the driving shaft 2 with the exterior member such as the stationary frame 4 is suppressed, so as to reduce the resonance effect. Consequently, the driven member 3 and the movable lens 90 can be moved accurately.

Thus, as has been described heretofore, according to the piezoelectric element 1 according to the embodiment of the invention, since the input terminals 11, 12 are provided at the non-extendible and non-contractible portions, the wiring member for inputting driving signals to the electrodes 17, 18 is soldered to the input terminals 11, 12 at the non-extendible and non-contractible portion 15. Because of this, since the connecting portion with the wiring member such as the printed wiring substrate 88 does not exist in the position where the extendible and contractible portion 13 lies, the problem can be avoided that the connecting portion affects the extending and contracting motions of the extendible and contractible portion 13. For example, in the event that the solder connecting portion with the wiring member exists in the position where the extendible and contractible portion 13 lies, since the solder connecting portion is strong and rigid, the extending and contracting motions of the extendible and contractible portion 13 is interrupted. However, with the piezoelectric element 1 according to the embodiment, such a defect can be avoided. Consequently, a good operating property can be obtained.

In addition, with the piezoelectric element 1 according to the embodiment of the invention, since the input terminals 11, 12 are formed at the end portions of the electrodes 17, 18, a good wettability of solder is provided when the wiring member is connected to the input terminals 11, 12, whereby a smooth connection of the wiring member can be implemented. Namely, since the input terminals 11, 12 are formed at the end portions of the electrodes 17, 18, heat given to the input terminals 11, 12 when soldering is performed is made difficult to escape to other portions, providing a good wettability of solder, whereby the connection of the wiring member to the input terminals 11, 12 is facilitated, a smooth connecting work being thereby implemented.

Furthermore, since the two input terminals 11, 12 are both formed at the same end portion of the piezoelectric element 1, the piezoelectric element 1 can be attached to the wiring member such as the printed wiring substrate 88 by means of reflow. Consequently, the manufacturing of a driving apparatus utilizing the piezoelectric element 1 can be implemented with good efficiency, and hence, the manufacturing of such produces is improved.

With the driving apparatus according to the embodiment, since the input terminals 11, 12 of the piezoelectric element 1 are provided in the position where the non-extendible and non-contractible portion 15 lies, the wiring member is soldered to the electrodes 17, 18 via the input terminals 11, 12 in the position where the non-extendible and non-contractible portion 15 lies. Due to this, since the connecting portion with the wiring member does not exist in the position where the extendible and contractible portion 13 lies, the problem can be avoided that the connecting portion affects the extending and contracting motions of the extendible and contractible portion 13. Consequently, the extending and contracting performance of the piezoelectric element 1 is improved, thereby making it possible to realize an increase in the moving performance of the driven member 3.

In addition, since the input terminals 11, 12 are formed at the end portions of the electrodes 17, 18, a good wettability of solder is provided when the wiring member is connected to the input terminals 11, 12, whereby a smooth connection of the wiring member can be implemented.

In addition, with the driving apparatus according to the embodiment of the invention, since the two input terminals 11, 12 are both formed at the same end portion of the piezoelectric element 1, the piezoelectric element 1 can be attached to the wiring member such as the printed wiring substrate 88 by means of reflow. Consequently, the assemblage of the piezoelectric element 1 is facilitated, thereby making it possible to realize an increase in the manufacturing properties of the driving apparatus.

Additionally, since the wiring member is connected to the end portion of the piezoelectric element 1, the wiring member constitutes little interruption when the piezoelectric element 1 is assembled to the driving apparatus, a good assembling property being thereby provided. In addition, by utilizing the belt-like printed wiring substrate 88 as the wiring member, the two input terminals 11, 12 can be connected together by the single wiring member, a good assembling property being thereby provided.

In addition, the non-extendible and non-contractible portion 15, which is formed at the other end portion of the piezoelectric element 1 where the wring member is connected, can be made to function as the weight member by making the same non-extendible and non-contractible portion 15 heavier. Due to this, the driving shaft 2 side end portion of the piezoelectric element 1 can be caused to be displaced largely when it extends and contracts, thereby making it possible to move the driven member 3 with good efficiency.

Furthermore, by applying the driving apparatus according to the embodiment of the invention to an actuator which is a constituent component of a photographic optical system of a camera, a driving mechanism thereof can be made smaller in size, thereby making it possible to realize a reduction in the size of the camera. In addition, by applying the same driving apparatus to an actuator which is a constituent component of a photographic optical system of a camera equipped on a mobile phone, a driving mechanism thereof can be made smaller in size, thereby making it possible to realize a reduction in the size of the mobile phone. In addition to these applications, the driving apparatus can be applied to an actuator of a web camera or the like.

Note that the embodiment of the invention that has been described heretofore is such as to illustrate the examples of the piezoelectric element and the driving apparatus according to the invention. The piezoelectric element and the driving apparatus according to the invention are not limited to the piezoelectric element and the driving apparatus according to the embodiment, and therefore, the piezoelectric element and the driving apparatus according to the invention may be modified or applied to other applications without departing from the spirit and scope of the claims of the invention.

For example, while in the embodiment, the invention is described as being applied to the driving apparatus for driving the movable lens, the invention may be applied to a driving apparatus for driving any other things than the movable lens.

In addition, while in the embodiment, the case is described in which the piezoelectric element 1 is mounted in the stationary frame 4 via the support member 5, whereby the end portion of the piezoelectric member 1 is made to constitute the free end, a configuration may be adopted in which the end portion of the piezoelectric element 1 is attached to the stationary frame 4.

According to the invention, the effects can be reduced which are imposed on the operation of the piezoelectric element by the connecting portion of the wiring member which is connected to the piezoelectric element.

The entire disclosure of each and every foreign patent application from which the benefit of foreign priority has been claimed in the present application is incorporated herein by reference, as if fully set forth.

What is claimed is:

1. A piezoelectric element comprising:
   a first non-extendible and non-contractible portion which neither extend nor contract, the first non-extendible and non-contractible portion being provided at one end of the piezoelectric element;
   an extendible and contractible portion which extends and contracts;
   a plurality of electrodes which are provided on a surface of the extendible and contractible portion and are provided so as to extend to a position where a surface of the first non-extendible and non-contractible portion lies;
   a plurality of connecting terminals which are connected to said plurality of electrodes and are provided in a position where the first non-extendible and non-contractible portion lies; and
   a flexible printed wiring substrate positioned to be adjacent to a back end surface of said first non-extendible and non-contractible portion, wherein
   said plurality of connecting terminals are connected to the flexible printed wiring substrate.

2. The piezoelectric element as set forth in claim 1,
   wherein said at least one electrode comprises two electrodes provided in such a way as to sandwich the extendible and contractible portion, and
   said at least one connecting terminal comprises two connecting terminals that are provided to be connected to the two electrodes, respectively, and are both provided on a side of the one end of the piezoelectric element where the first non-extendible and non-contractible portion lies.

3. A driving apparatus comprising:
   a piezoelectric element;
   a driving shaft that reciprocates in response to an extension and contraction of the piezoelectric element; and
   a driven member, frictionally engaged with the driving shaft, that moves along the driving shaft by reciprocating the driving shaft,
   wherein the piezoelectric element comprises:
   a first non-extendible and non-contractible portion which neither extend nor contract, the first non-extendible and non-contractible portion being provided at one end of the piezoelectric element;
   an extendible and contractible portion which extends and contracts;
   a plurality of electrodes which are provided on a surface of the extendible and contractible portion and are provided so as to extend to a position where a surface of the first non-extendible and non-contractible portion lies;
   a plurality of connecting terminals which are connected to said plurality of electrodes and are provided in a position where the first non-extendible and non-contractible portion lies; and
   a flexible printed wiring substrate positioned to be adjacent to a back end surface of said first non-extendible and non-contractible portion, wherein
   said plurality of connecting terminals are connected to the flexible printed wiring substrate.

4. The driving apparatus as set forth in claim 3,
   wherein said at least one electrode comprises two electrodes provided in such a way as to sandwich the extendible and contractible portion, and
   said at least one connecting terminal comprises two connecting terminals that are provided to be connected to the two electrodes, respectively, and are both provided on a side of the one end of the piezoelectric element where the first non-extendible and non-contractible portion lies.

5. The driving apparatus as set forth in claim 3,
   wherein the driving shaft is attached to the other end of the piezoelectric element, and
   the driving apparatus further comprises a wiring member, attached to the one end of the piezoelectric element, that is to be connected to said at least one connecting terminal.

6. The driving apparatus as set forth in claim 5,
   wherein the piezoelectric element further comprises a second non-extendible and non-contractible portion provided at the other end of the piezoelectric element, the one end of the piezoelectric element to which the wiring member is attached is made to constitute a free end, and the first non-extendible and non-contractible portion become heavier than the second non-extendible and non-contractible portion.

7. The driving apparatus as set forth in claim 3, wherein each of the plurality of connecting terminals has a first leg and a second leg formed in an L-shape with the first leg of each being formed on an unsupported free end surface of said first non-extendible and non-contractible portion at the unsupported free end of the piezoelectric element adjacent to and connected with the flexible printed wiring substrate positioned thereat and with the second leg of each being electrically connected to a corresponding connection part of a corresponding electrode.

8. The driving apparatus as set forth in claim 3, wherein two connecting terminals are provided and each has a first leg and a second leg formed in an L-shape with the first leg of each being formed on an unsupported free end surface of said first non-extendible and non-contractible portion at the unsupported free end of the piezoelectric element adjacent to and connected with the flexible printed wiring substrate positioned thereat and with the second leg of each being electrically connected to a corresponding connection part of a corresponding electrode.

9. The piezoelectric element as set forth in claim 1, wherein each of said plurality of connecting terminals has an L-shape and is positioned at a respective corner of said first non-extendible and non-contractible portion that is formed between a respective side surface of said first non-extendible and non-contractible portion and said back end surface, and one leg of each L-shaped connecting terminal extends from said respective corner along said respective side surface to provide electrical contact with a corresponding one of the plurality of electrodes along said respective side surface and a second leg of the L-shaped connecting terminal extends from said respective corner along said back end surface to provide electrical contact with the flexible printed wiring substrate along said back end surface.

10. The piezoelectric element as set forth in claim 1, wherein said plurality of electrodes comprises two electrodes provided in such a way as to sandwich the extendible and contractible portion and to extend to a first side surface and a second side surface on an opposite side of said first non-extendible and non-contractible portion, and said plurality of connecting terminals comprises two connecting terminals that both have an L-shape and are separately provided to be at opposite side corners formed between said back end surface and each of said first side surface and said second side surface so that said one leg of each of said L-shaped connecting terminals extends from each said corner along each corresponding one of said first side surface and second side surface to make electrical contact with a corresponding one of the two connecting electrodes along that corresponding side surface and said second leg of each of said L-shaped connecting terminals extends from each said corner along said back end surface to provide electrical contact with the flexible printed wiring substrate along said back end surface.

11. The driving apparatus as set forth in claim 3, wherein the first non-extendible and non-contractible portion is provided at an unsupported free end of the piezoelectric element, the extendible and contractible portion extends and contracts to provide the extension and contraction of the piezoelectric element, the extendible and contractible portion is formed as a middle portion of the piezoelectric element between the first non-extendible and non-contractible portion at the unsupported free end side of the piezoelectric element and a second non-extendible and non-contractible portion that cannot extend or contract that is provided at a second end of the piezoelectric element coupled to the driving shaft so as to couple said expansion and contraction of the extendible and contractible portion to the driving shaft, the plurality of electrodes are provided on respective side surfaces of the extendible and contractible portion and are provided so as to extend so that at least a part of the respective side surface of the first non-extendible and non-contractible portion lies under a connection part of the plurality of electrodes, and the first non-extendible and non-contractible portion is provided so as to be heavier than the second non-extendible and non-contractible portion so that the first non-extendible and non-contractible portion provided at the unsupported free end of the piezoelectric element is relatively stationary as compared to the second non-extendible and non-contractible portion that is coupled to the driving shaft and can move so as to couple said expansion and contraction of the extendible and contractible portion to the driving shaft.

* * * * *